US009331110B2

(12) United States Patent
Tatani

(10) Patent No.: US 9,331,110 B2
(45) Date of Patent: May 3, 2016

(54) SEMICONDUCTOR DEVICE, METHOD OF MANUFACTURING SEMICONDUCTOR DEVICE, AND SOLID-STATE IMAGING APPARATUS

(75) Inventor: Keiji Tatani, Kumamoto (JP)

(73) Assignee: SONY CORPORATION, Tokyo (JP)

( * ) Notice: Subject to any disclaimer, the term of this patent is extended or adjusted under 35 U.S.C. 154(b) by 96 days.

(21) Appl. No.: 12/926,878

(22) Filed: Dec. 15, 2010

(65) Prior Publication Data

US 2011/0180859 A1  Jul. 28, 2011

(30) Foreign Application Priority Data

Jan. 28, 2010  (JP) ................................ 2010-016284

(51) Int. Cl.
*H01L 27/146*  (2006.01)

(52) U.S. Cl.
CPC ...... *H01L 27/14603* (2013.01); *H01L 27/1461* (2013.01); *H01L 27/14612* (2013.01); *H01L 27/14645* (2013.01); *H01L 27/14689* (2013.01)

(58) Field of Classification Search
CPC .................... H01L 47/14603; H01L 47/1461; H01L 27/14603; H01L 27/1461
USPC ............................ 257/257, 258, 432, E31.103
See application file for complete search history.

(56) References Cited

U.S. PATENT DOCUMENTS

| 7,049,671 | B2 * | 5/2006 | Kimura .......................... 257/437 |
| 7,391,453 | B2 * | 6/2008 | Ohkawa ......................... 348/302 |
| 2004/0232494 | A1 | 11/2004 | Nagano et al. |
| 2006/0131624 | A1 * | 6/2006 | Katsuno et al. ............... 257/292 |
| 2006/0214121 | A1 * | 9/2006 | Schrey et al. ............. 250/559.38 |
| 2006/0286708 | A1 * | 12/2006 | Rhodes ............................ 438/57 |
| 2007/0138568 | A1 * | 6/2007 | Nagano et al. ................ 257/369 |
| 2008/0029793 | A1 * | 2/2008 | Watanabe et al. ............. 257/291 |
| 2008/0160660 | A1 * | 7/2008 | Shim ................................ 438/59 |
| 2009/0011532 | A1 * | 1/2009 | Shimotsusa et al. ............ 438/59 |
| 2009/0039430 | A1 * | 2/2009 | Ushitani et al. ............... 257/350 |
| 2011/0081766 | A1 * | 4/2011 | Liu et al. ........................ 438/424 |
| 2011/0169992 | A1 * | 7/2011 | Endo et al. ..................... 348/308 |
| 2011/0180859 | A1 * | 7/2011 | Tatani ........................... 257/291 |
| 2014/0054663 | A1 * | 2/2014 | Koizumi et al. ............... 257/292 |

FOREIGN PATENT DOCUMENTS

| CN | 1552100 A | 12/2004 |
| WO | WO-03/096421 | 11/2003 |

OTHER PUBLICATIONS

Chinese Office Action issued Jun. 5, 2014 for corresponding Chinese Application No. 201110023602.5.

* cited by examiner

*Primary Examiner* — Joseph C Nicely
(74) *Attorney, Agent, or Firm* — Michael Best & Friedrich LLP

(57) ABSTRACT

A semiconductor device includes a gate electrode formed on a substrate with a gate insulating layer in between, an insulating layer of property and thickness that allow for a silicide block formed in a first region of the substrate so as to cover the gate electrode, a sidewall formed to at least partly include the insulating layer at a side of the gate electrode, a first impurity region formed by implantation of a first impurity in a peripheral region of the gate electrode formed in the first region of the substrate before the insulating layer is formed, a second impurity region formed by implantation of a second impurity in a peripheral region of the sidewall of the gate electrode formed in a second region of the substrate after the sidewall is formed, and a silicide layer formed on a surface of the second impurity region of the substrate.

19 Claims, 16 Drawing Sheets

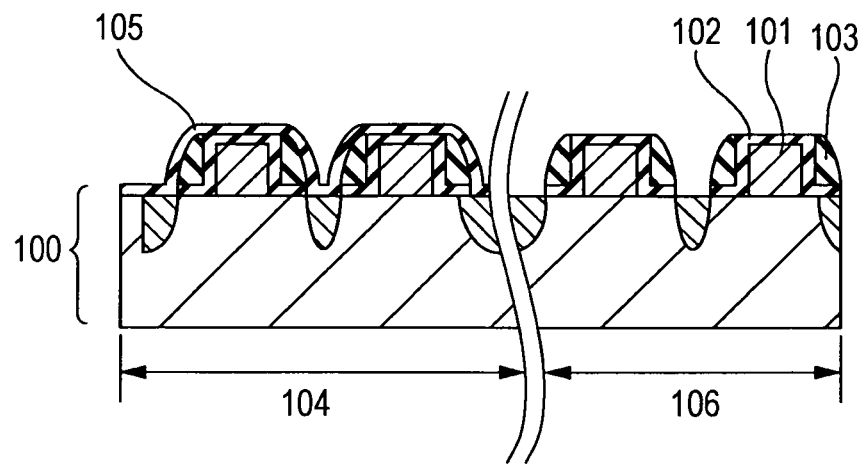
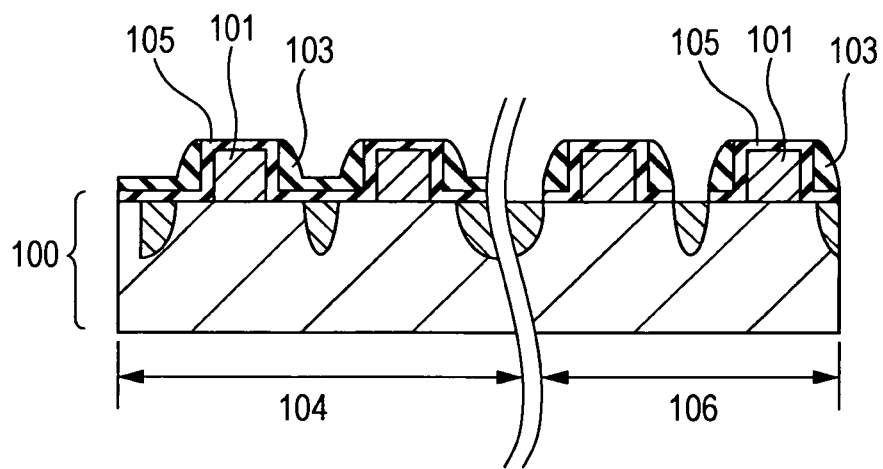

SEMICONDUCTOR DEVICE, METHOD OF MANUFACTURING SEMICONDUCTOR DEVICE, AND SOLID-STATE IMAGING APPARATUS

BACKGROUND OF THE INVENTION

1. Field of the Invention

The present invention relates to a semiconductor device, a method of manufacturing the semiconductor device, and a solid-state imaging apparatus. Specifically, the present invention relates to a semiconductor device including a transistor formed with a silicide layer, a method of manufacturing the semiconductor device, and a solid-state imaging apparatus.

2. Description of the Related Art

Typical solid-state imaging devices which convert image light as an image signal to an electrical signal include a CCD image sensor and a MOS image sensor.

In the MOS image sensor, an imaging region including a light receiving unit (photodiode) which generates electrical charge with light radiation and a peripheral circuit region which reads the electrical charge generated in the imaging region as an electrical signal (voltage signal in most cases) are provided on a common substrate. Herein, a pixel transistor (MOS transistor) is formed in the imaging region, and a peripheral transistor (MOS transistor) is formed in the peripheral circuit region.

Along with a further increase in drive speed of solid-state imaging devices in recent years, it is desirable that a peripheral transistor also be driven at high speed. In order to improve the operation speed of a peripheral transistor to meet such demand, patent documents such as International Publication No. 03/096421 disclose a technique for forming a silicide layer, which is a compound of a refractory metal such as Ti or Co and Si, on each surface of a gate electrode, a source region, and a drain region of the peripheral transistor.

A silicide layer is formed by forming a layer of a refractory metal on the surface of a source region or a drain region and reacting silicon and the refractory metal. However, incomplete reaction of the silicon and the refractory metal and diffusion of the unreacted refractory metal which occurs with some probability can cause metal contamination such as a white spot.

Therefore, a configuration is preferable in which a silicide layer is not formed in an imaging region. That is, a configuration is preferable in which a silicide layer is formed in a transistor provided in a peripheral circuit region and a silicide layer is not formed in a transistor provided in an imaging region.

As one example of a method of forming a silicide layer only in a transistor in a peripheral circuit region, it is conceivable to form a blocking layer which prevents a refractory metal from contacting a silicon substrate only in the imaging region in addition to a sidewall.

Specifically, as shown in FIG. 17A, a gate electrode 101 is formed on a silicon substrate 100 with a gate insulating layer (not shown) in between, an oxide layer 102 is formed as a layer on top of the gate electrode 101, and a nitride layer 103 is further formed as a layer on top of the oxide layer 102. Note that a sidewall is formed by an etch-back process on the oxide layer 102 and the nitride layer 103. By forming a nitride layer 105 which functions as a blocking layer only in an imaging region 104 for a transistor configured in this manner, a silicide layer can be formed only in a transistor in a peripheral circuit region 106.

As another example of the method of forming a silicide layer only in a transistor in a peripheral circuit region, it is conceivable to form a blocking layer which prevents a refractory metal from contacting a silicon substrate in an imaging region as a part of a layer forming a sidewall.

Specifically, as shown in FIG. 17B, the gate electrode 101 is formed on the silicon substrate 100 with a gate insulating layer (not shown) in between, and the nitride layer 105 which functions as a blocking layer is formed as a layer on top of the gate electrode 101. Further, the nitride layer 103 is formed as a layer on top of the nitride layer 105. Note that a sidewall is formed by an etch-back process on the nitride layer 105 and the nitride layer 103, and that the nitride layer 105 and the nitride layer 103 are removed from a source region and a drain region of a transistor in the peripheral circuit region 106.

Since only the surface of the source region and the drain region of the transistor in the peripheral circuit region 106 of the silicon substrate 100 is exposed, a silicide layer can be formed only in the transistor in the peripheral circuit region 106.

SUMMARY OF THE INVENTION

However, the above-described method of forming the blocking layer only in the imaging region in addition to the sidewall leads to an increase in the number of steps. Also, layout in forming the blocking layer becomes limited.

On the other hand, in the above-described method of forming the blocking layer in the imaging region as a part of the layer forming the sidewall, ion implantation is performed through the blocking layer in order to form a source region or a drain region of a transistor in the imaging region. The ion implantation performed through the blocking layer is extremely difficult to control and may cause characteristic degradation.

Also, when a nitride layer is employed as the blocking layer, a knock-on effect occurs in which a nitrogen atom in the nitride layer is shot into the silicon substrate by ion bombardment at the time of the ion implantation through the blocking layer, causing a defect such as a white spot and thus characteristic degradation.

It is desirable to provide a semiconductor device, a method of manufacturing the semiconductor device, and a solid-state imaging apparatus that enable supply of a product of stable quality without increasing the number of steps.

A semiconductor device according to an embodiment of the present invention includes a gate electrode formed on a substrate with a gate insulating layer in between, an insulating layer of property and thickness that allow for a silicide block formed in a first region of the substrate so as to cover the gate electrode, a sidewall formed to at least partly include the insulating layer at a side of the gate electrode, a first impurity region formed by implantation of a first impurity in a peripheral region of the gate electrode formed in the first region of the substrate before the insulating layer is formed, a second impurity region formed by implantation of a second impurity in a peripheral region of the sidewall of the gate electrode formed in a second region of the substrate after the sidewall is formed, and a silicide layer formed on a surface of the second impurity region of the substrate.

Since the first impurity region is formed by the implantation of the first impurity in the peripheral region of the gate electrode formed in the first region of the substrate before the insulating layer which functions as a blocking layer is formed and ion implantation is not performed through the blocking layer, characteristic degradation of the semiconductor device can be prevented.

Also, by the sidewall being formed to at least partly include the insulating layer such as a nitride layer which functions as the blocking layer, the number of manufacturing steps can be reduced. That is, since the blocking layer can be formed as a part of the sidewall without forming a blocking layer in addition to the sidewall when the semiconductor device is manufactured, the number of manufacturing steps can be reduced.

Note that forming the silicide layer also on the surface of the gate electrode provided in the second region can further improve the operation speed of a transistor.

A method of manufacturing a semiconductor device according to another embodiment of the present invention includes the steps of forming a gate electrode on a substrate including a first region in which a silicide layer is not formed and a second region in which a silicide layer is formed with a gate insulating layer in between, forming a first impurity region by implantation of a first impurity in a peripheral region of the gate electrode formed in the first region, forming, in the substrate formed with the first impurity region, an insulating layer of property and thickness that allow for a silicide block so as to cover the gate electrode, forming a sidewall at least partly including the insulating layer at a side of the gate electrode, forming an opening portion in a region of the insulating layer corresponding to a peripheral region of the sidewall of the gate electrode formed in the second region to expose a surface of the substrate, forming a second impurity region by implantation of a second impurity in the second region of the substrate including the insulating layer formed with the opening portion, and forming a silicide layer by forming a metal layer with which silicidation is possible as a layer on top of the insulating layer formed with the opening portion and causing a silicide reaction.

By forming the first impurity region with the implantation of the first impurity before the insulating layer such as a nitride layer which functions as a blocking layer is formed in the substrate, ion implantation can be not performed through the blocking layer, thus preventing characteristic degradation of a semiconductor device.

Also, by the sidewall being formed to at least partly include the insulating layer such as a nitride layer which functions as the blocking layer at the side of the gate electrode, the number of manufacturing steps can be reduced. That is, by forming the blocking layer not in addition to the sidewall but as a part of the sidewall, the number of manufacturing steps can be reduced.

Note that, by forming the first impurity region by the implantation of the first impurity in the peripheral region of the gate electrode formed in the first region, a source region and a drain region of a transistor can be formed in the first region of the substrate. Also, by forming the second impurity region by the implantation of the second impurity in the second region of the substrate including the insulating layer formed with the opening portion, a source region and a drain region of a transistor can be formed in the second region of the substrate.

Also, by opening the region of the insulating layer corresponding to the gate electrode formed in the second region to expose the surface of the gate electrode when forming the opening portion of the insulating layer, the silicide layer can be formed also on the surface of the gate electrode to further improve the operation speed of the transistor.

A solid-state imaging apparatus according to still another embodiment of the present invention includes a gate electrode formed on a substrate with a gate insulating layer in between, an insulating layer of property and thickness that allow for a silicide block formed in an imaging region of the substrate so as to cover the gate electrode, a sidewall formed to at least partly include the insulating layer at a side of the gate electrode, a first impurity region formed by implantation of a first impurity in a peripheral region of the gate electrode formed in the imaging region of the substrate before the insulating layer is formed, a second impurity region formed by implantation of a second impurity in a peripheral region of the sidewall of the gate electrode formed in a peripheral circuit region of the substrate after the sidewall is formed, a silicide layer formed on a surface of the second impurity region of the substrate, and an optical system which guides incident light to the imaging region.

Since the first impurity region is formed by the implantation of the first impurity in the peripheral region of the gate electrode formed in the imaging region of the substrate before the insulating layer which functions as a blocking layer is formed and ion implantation is not performed through the blocking layer, characteristic degradation of the solid-state imaging apparatus can be prevented.

Also, by the sidewall being formed to at least partly include the insulating layer such as a nitride layer which functions as the blocking layer, the number of manufacturing steps can be reduced. That is, since the blocking layer can be formed as a part of the sidewall without forming a blocking layer in addition to the sidewall when the solid-state imaging apparatus is manufactured, the number of manufacturing steps can be reduced.

Note that forming the silicide layer also on the surface of the gate electrode provided in the peripheral circuit region can further improve the operation speed of a transistor.

With the semiconductor device, the method of manufacturing the semiconductor device, and the solid-state imaging apparatus according to the embodiments of the present invention, a product of high quality can be supplied without increasing the number of steps and while further preventing characteristic degradation.

BRIEF DESCRIPTION OF THE DRAWINGS

FIGS. 17A and 17B are schematic views for illustrating a method of forming a silicide layer only in a transistor in a peripheral circuit region.

DESCRIPTION OF THE PREFERRED EMBODIMENTS

Modes for carrying out the invention (hereinafter referred to as embodiments) will be described below in the following order.
1. Embodiment (description on a MOS image sensor)
2. Another embodiment (description on a camera system)
3. Modification example
<1. Embodiment>
[Configuration of a MOS Image Sensor]

Figure 1:
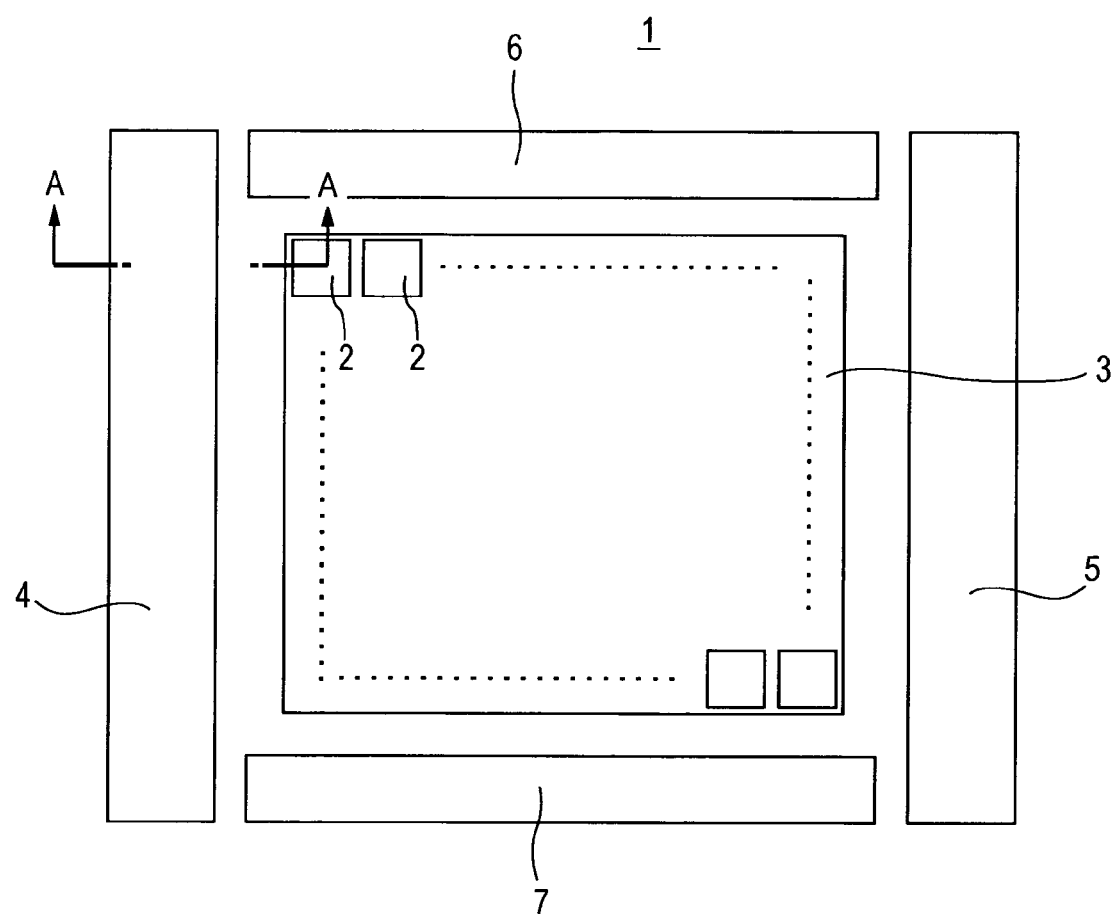
FIG. 1 is a schematic view for illustrating a MOS image sensor as an example of a semiconductor device according to an embodiment of the present invention.

FIG. 1 is a schematic view for illustrating a MOS image sensor as an example of a semiconductor device according to an embodiment of the present invention. A MOS image sensor 1 shown herein includes an imaging region 3 in which multiple pixels 2 configured of a photodiode as a sensor unit and multiple MOS transistors are arranged in a matrix. The MOS image sensor 1 also includes CMOS logic circuit units 4 and 5 and analog circuits 6 and 7 as a peripheral circuit region formed in the periphery of the imaging region 3.

The MOS image sensor 1 is configured of the imaging region 3 and the peripheral CMOS logic circuit units 4 and 5 and analog circuits 6 and 7 built on a common semiconductor substrate into one chip.

Note that the imaging region 3 is an example a first region in which a silicide layer is not formed, and the peripheral circuit region of the CMOS logic circuit units 4 and 5 and the analog circuits 6 and 7 is an example of a second region in which a silicide layer is formed.

Although the number of the MOS transistors forming the pixel 2 differs depending on the configuration of the pixel, at least a MOS transistor for driving the photodiode and a signal-output MOS transistor for outputting a signal of the photodiode are provided.

Note that the MOS transistor for driving the photodiode refers to a read MOS transistor for reading a signal charge of the photodiode.

Figure 2A:
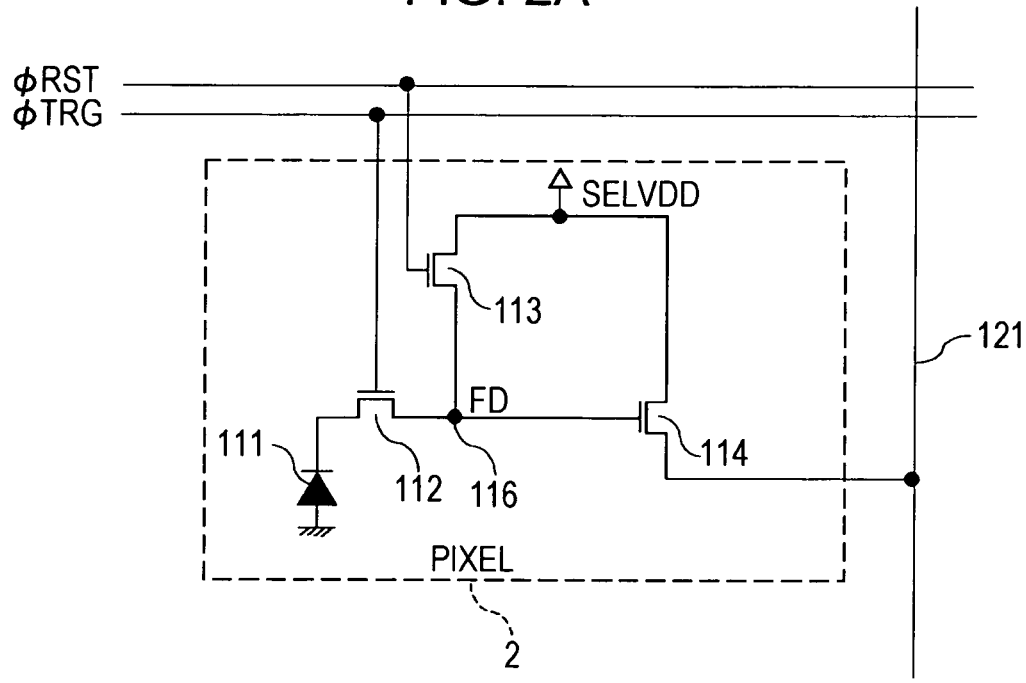
FIG. 2A is a schematic view for illustrating a circuit configuration of a pixel.

FIG. 2A is a schematic view for illustrating an example of the circuit configuration of the pixel 2. The pixel 2 shown herein has a pixel circuit including three pixel transistors, i.e., a transfer transistor 112, a reset transistor 113, and an amplification transistor 114, in addition to a photodiode 111.

Note that, herein, a case where n-channel MOS transistors are used as the pixel transistors 112 to 114 is given as an example.

The transfer transistor 112 is connected between a cathode of the photodiode 111 and a floating diffusion (FD) unit 116. The transfer transistor 112 transfers a signal charge (electron) obtained from photoelectric conversion and stored in the photodiode 111 to the FD unit 116 by applying a transfer pulse φTRG to the gate.

The drain and source of the reset transistor 113 are respectively connected to a selection power supply SELVDD and the FD unit 116. The reset transistor 113 resets the electrical potential of the FD unit 116 by applying a reset pulse φRST to the gate before transfer of the signal charge from the photodiode 111 to the FD unit 116.

Note that the selection power supply SELVDD is a power supply that selectively adopts VDD level and GND level as a power supply voltage.

The amplification transistor 114 has a source follower configuration in which the gate, the drain, and the source are respectively connected to the FD unit 116, the selection power supply SELVDD, and the vertical signal line 121. The amplification transistor 114 shifts to an operation state when the selection power supply SELVDD shifts to VDD level to select the pixel 2, and outputs the electrical potential of the FD unit 116 after reset by the reset transistor 113 as a reset level to the vertical signal line 121. Further, the amplification transistor 114 outputs the electrical potential of the FD unit 116 after the transfer of the signal charge by the transfer transistor 112 as the signal level to the vertical signal line 121.

Figure 3:
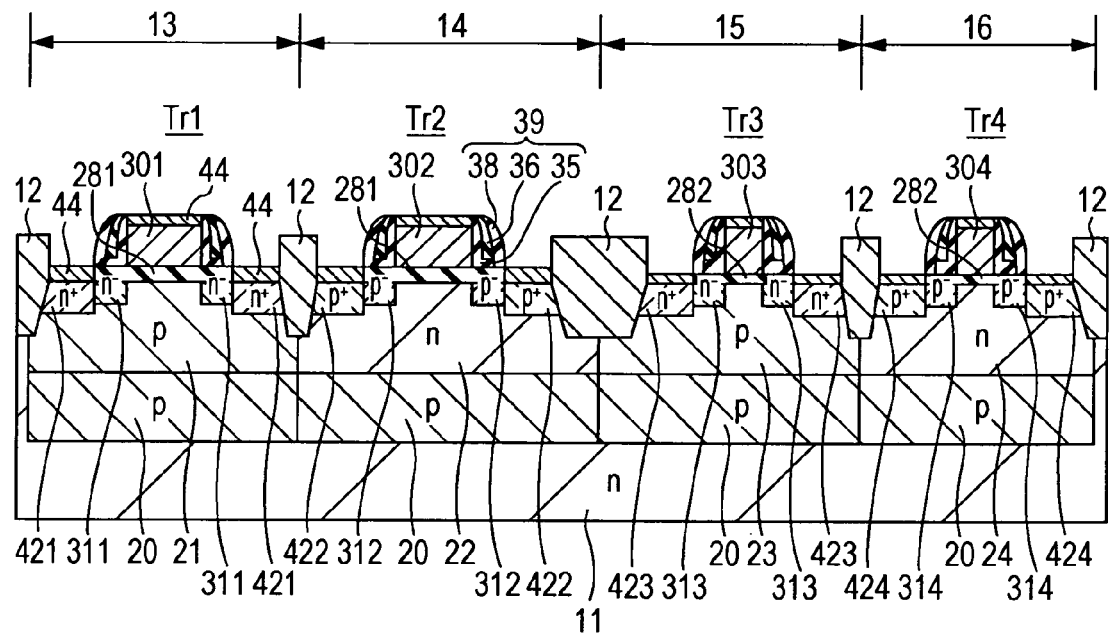
FIG. 3 is a schematic sectional view for illustrating a CMOS logic circuit unit along line A-A in FIG. 1.
Figure 4:
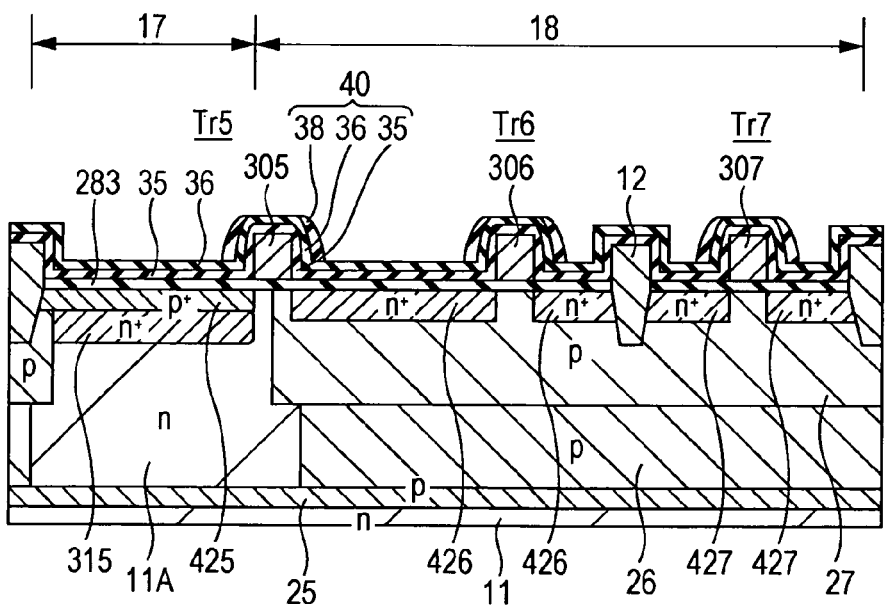
FIG. 4 is a schematic sectional view for illustrating a pixel along line A-A in FIG. 1.

FIG. 3 is a schematic sectional view for illustrating the CMOS logic circuit unit 4 along line A-A in FIG. 1, and FIG. 4 is a schematic sectional view for illustrating the pixel 2 along line A-A in FIG. 1.

In the MOS image sensor 1 shown herein, an isolation region 12 is formed in an n-type semiconductor substrate 11, the pixel 2 forming the imaging region 3 is formed in an appropriate region of the n-type semiconductor substrate 11, and the CMOS logic circuit unit 4 is formed in another appropriate region of the n-type semiconductor substrate 11.

First, in the CMOS logic circuit unit 4, a p-type semiconductor well region 20 into which a p-type impurity is introduced is formed in a deep position in the n-type semiconductor substrate 11, as shown in FIG. 3. In a first MOS transistor forming region denoted by a reference numeral 13 in the drawing, a p-type semiconductor well region 21 is formed from the surface of the n-type semiconductor substrate 11 down to the p-type semiconductor well region 20. In a similar manner, in a third MOS transistor forming region denoted by a reference numeral 15 in the drawing, a p-type semiconductor well region 23 is formed from the surface of the n-type semiconductor substrate 11 down to the p-type semiconductor well region 20. Further, in a second MOS transistor forming region denoted by a reference numeral 14 in the drawing, an n-type semiconductor well region 22 is formed from the surface of the n-type semiconductor substrate 11 down to the p-type semiconductor well region 20. In a similar manner, in a fourth MOS transistor forming region denoted by a reference numeral 16 in the drawing, an n-type semiconductor well region 24 is formed from the surface of the n-type semiconductor substrate 11 down to the p-type semiconductor well region 20.

On the p-type semiconductor well region 21 and on the n-type semiconductor well region 22, gate electrodes 301 and 302 formed of a polycrystalline silicon layer are formed with a gate insulating layer 281 in between. In the p-type semiconductor well region 21, a source region and a drain region having an LDD structure formed of an n$^-$ region 311 and an n$^+$ region 421 are formed across the gate electrode 301 to form an n-channel MOS transistor Tr1. Further, in the n-type semiconductor well region 22, a source region and a drain region having an LDD structure formed of a p⁻ region 312 and a p⁺ region 422 are formed across the gate electrode 302 to form a p-channel MOS transistor Tr2.

Note that the n-channel MOS transistor Tr1 and the p-channel MOS transistor Tr2 form a CMOS transistor.

Also, on the p-type semiconductor well region 23 and on the n-type semiconductor well region 24, gate electrodes 303 and 304 formed of a polycrystalline silicon layer are formed with a gate insulating layer 282, in between. Further, in the p-type semiconductor well region 23, a source region and a drain region having an LDD structure formed of an n⁻ region 313 and an n⁺ region 423 are formed across the gate electrode 303 to form an n-channel MOS transistor Tr3. In the n-type semiconductor well region 24, a source region and a drain region having an LDD structure formed of a p⁻ region 314 and a p⁺ region 424 are formed across the gate electrode 304 to form a p-channel MOS transistor Tr4.

Note that the n-channel MOS transistor Tr3 and the p-channel MOS transistor Tr4 form a CMOS transistor.

At the side of the gate electrodes 301 to 304 of the respective MOS transistors Tr1 to Tr4, a sidewall 39 having a three layer structure in which a first insulating layer 35, a second insulating layer 36, and a third insulating layer 38 are sequentially stacked is formed. Specifically, a case where silicon oxide layers are employed as the first insulating layer 35 and the third insulating layer 38 and a silicon nitride layer is used as the second insulating layer 36 can be given as an example.

Further, on the surface of the gate electrodes 301 to 304 and the surface of the source region and the drain region of the respective MOS transistors Tr1 to Tr4, a refractory metal silicide layer 44 is formed.

Note that a tungsten silicide layer, a titanium silicide layer, a cobalt silicide layer, a nickel silicide layer, or the like can be given as an example of the refractory metal silicide layer.

Next, in the pixel 2, a p-type semiconductor well region 25 into which a p-type impurity is introduced is formed in a deep position in the n-type semiconductor substrate 11, as shown in FIG. 4. In a sensor unit forming region denoted by a reference numeral 17 in the drawing, an n-type semiconductor region 315 having a higher impurity concentration than an n-type semiconductor region 11A is formed on the surface side of the n-type semiconductor region 11A.

Note that the n-type semiconductor region 11A is a part of the n-type semiconductor substrate 11 isolated by the p-type semiconductor well region 25 formed through ion implantation in the deep position in the n-type semiconductor substrate 11.

Further, on the surface of the n-type semiconductor substrate 11, a p⁺ semiconductor region 425 having a high impurity concentration is formed to contact the n-type semiconductor region 11A for the purpose of reducing junction leakage current.

Note that the p-type semiconductor well region 25, the n-type semiconductor region 11A, and the p⁺ semiconductor region 425 form the sensor unit of the photodiode, i.e., a HAD sensor.

Also, in a MOS transistor forming region denoted by a reference numeral 18 in the drawing, p-type semiconductor well regions 26 and 27 are formed from the surface of the n-type semiconductor substrate 11 down to the p-type semiconductor well region 25.

Further, gate electrodes 305, 306, and 307 formed of a polycrystalline silicon layer are formed with a gate insulating layer 283 underneath, and an n⁺ region 426 and an n⁺ region 427 are formed as a source region and a drain region.

In this manner, multiple n-channel MOS transistors, e.g., a read MOS transistor Tr5 for reading a signal charge of the sensor unit and signal-output MOS transistors Tr6 and Tr7 for outputting a signal, are formed.

Note that an LDD structure is not employed in the MOS transistors Tr5 to Tr7.

Also, in a region of the pixel 2, the first insulating layer 35 and the second insulating layer 36 are formed so as to cover the region 17 in which the sensor unit is formed and to cover the region 18 in which the MOS transistors Tr5 to Tr7 are formed. Further, at the side of the respective gate electrodes 305 to 307, a sidewall 40 is formed with the third insulating layer.

Note that a refractory metal silicide layer is not formed on the surface of the gate electrodes 305 to 307 and the surface of the source region and the drain region in the MOS transistors Tr5 to Tr7.

In the MOS image sensor configured in a manner described above, the source region and the drain region are formed also below the sidewall 40 of the MOS transistors Tr5 to Tr7 in the pixel 2. Therefore, it is advantageous in reading a signal charge in the case of, for example, a transfer transistor which transfers a signal charge from a light receiving unit to a floating diffusion unit.

Also, a layer stack of the first insulating layer 35 (e.g., silicon oxide layer) and the second insulating layer 36 (e.g., silicon nitride layer) formed in the pixel 2 functions as an antireflection layer, whereby an incidence efficiency with respect to the sensor unit is improved.

[Manufacturing Method]

A method of manufacturing the MOS image sensor configured in the manner described above will be described below. That is, an example of a method of manufacturing a semiconductor device according to the embodiment of the present invention will be described.

Note that FIGS. 5A, 6A, 7A, 8A, 9A, 10A, 11A, 12A, 13A, 14A, and 15A show the CMOS logic circuit unit 4, and FIGS. 5B, 6B, 7B, 8B, 9B, 10B, 11B, 12B, 13B, 14B, and 15B show the pixel 2.

Figure 5A:
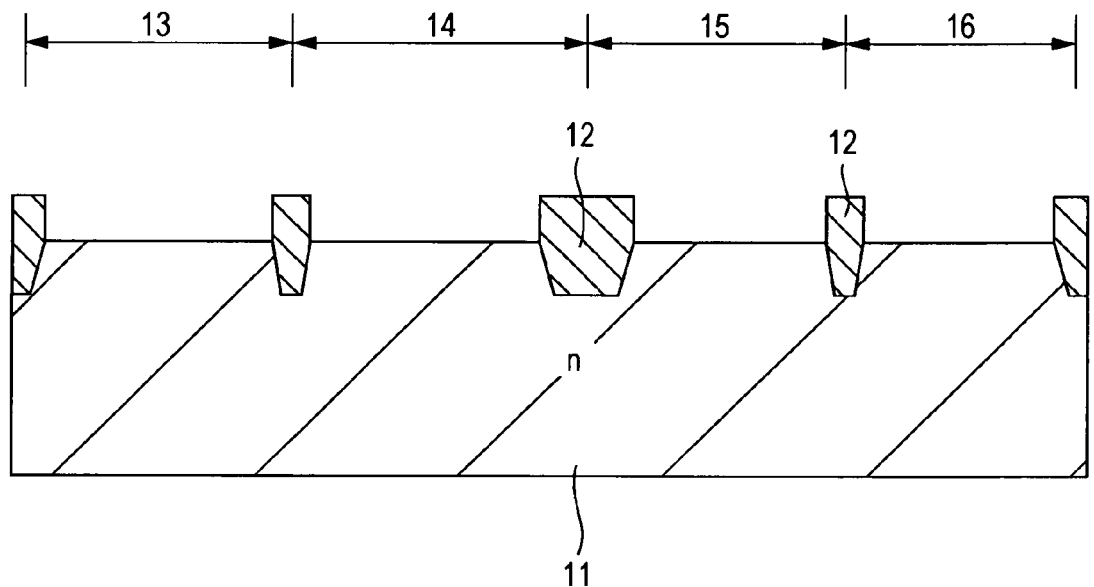
FIGS. 5A and 5B are schematic views for illustrating an example of a method of manufacturing a semiconductor device according to the embodiment of the present invention.
Figure 5B:
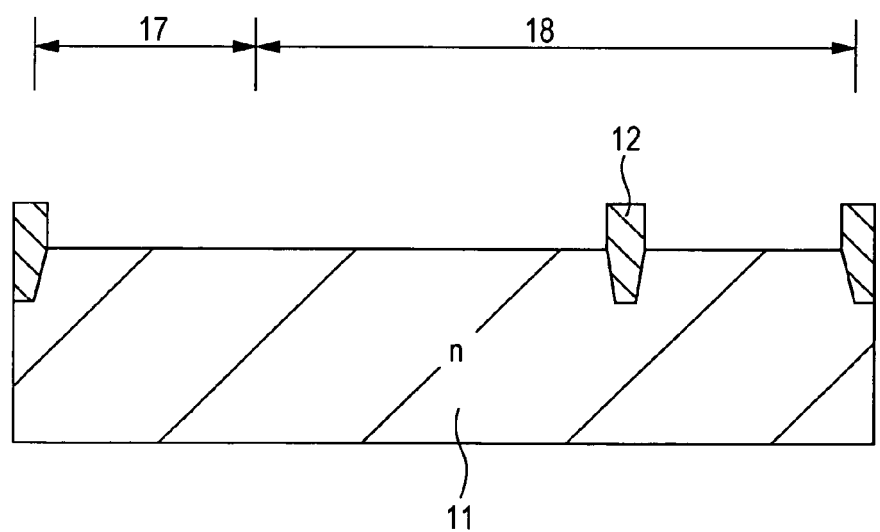

In the example of the method of manufacturing a semiconductor device according to the embodiment of the present invention, the isolation region 12 is first formed in the n-type semiconductor substrate 11 with a general method, as shown in FIGS. 5A and 5B.

For the CMOS logic circuit unit 4, the isolation region 12 is formed in order to form the first MOS transistor forming region 13, the second MOS transistor forming region 14, the third MOS transistor forming region 15, and the fourth MOS transistor forming region 16.

For the pixel 2, the isolation region 12 is formed in order to form the sensor unit forming region 17 and the MOS transistor forming region 18.

Figure 6A:
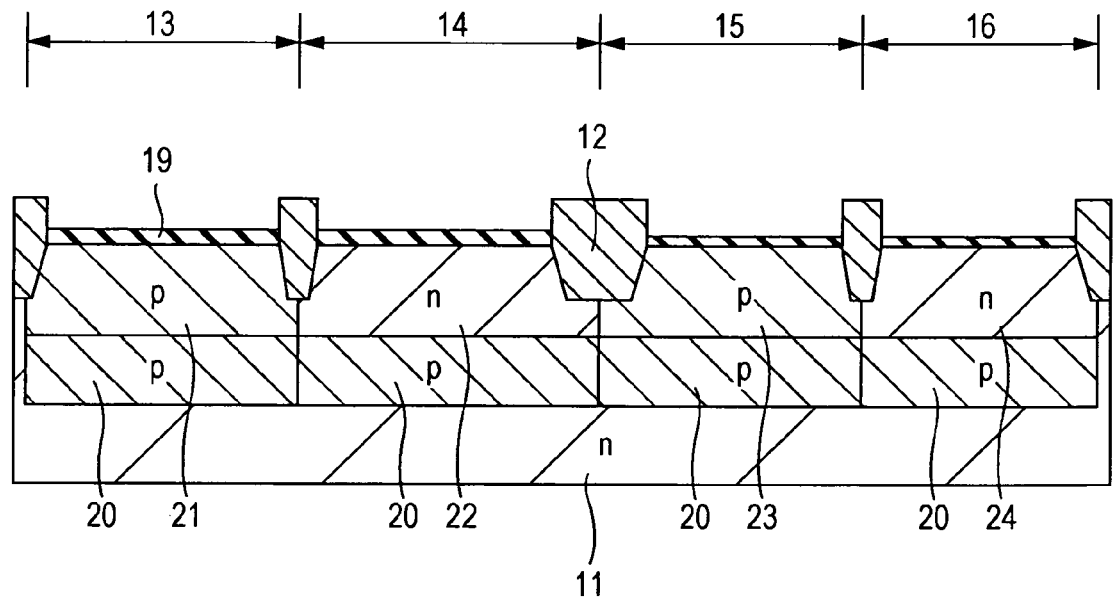
FIGS. 6A and 6B are schematic views for illustrating the example of the method of manufacturing a semiconductor device according to the embodiment of the present invention.
Figure 6B:
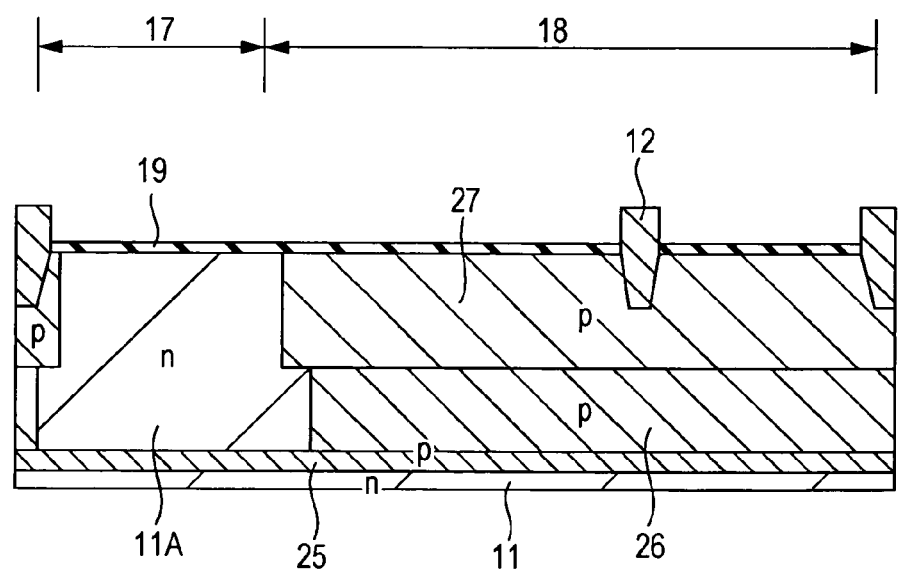

Next, as shown in FIGS. 6A and 6B, an insulating layer 19 is formed on the n-type semiconductor substrate 11, and an appropriate impurity is introduced by an ion implantation method to form a semiconductor well region of an appropriate conductivity type.

For the CMOS logic circuit unit 4, the p-type semiconductor well region 20, the p-type semiconductor well regions 21 and 23, and the n-type semiconductor well regions 22 and 24 are formed. For the pixel 2, the p-type semiconductor well regions 25, 26, and 27 are formed.

Figure 7A:
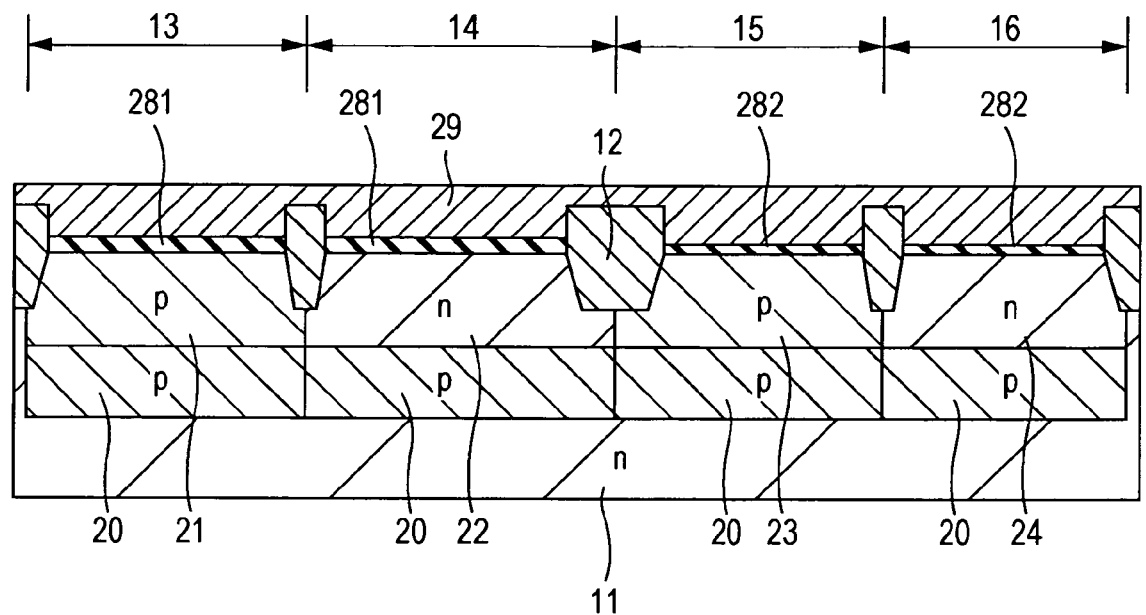
FIGS. 7A and 7B are schematic views for illustrating the example of the method of manufacturing a semiconductor device according to the embodiment of the present invention.
Figure 7B:
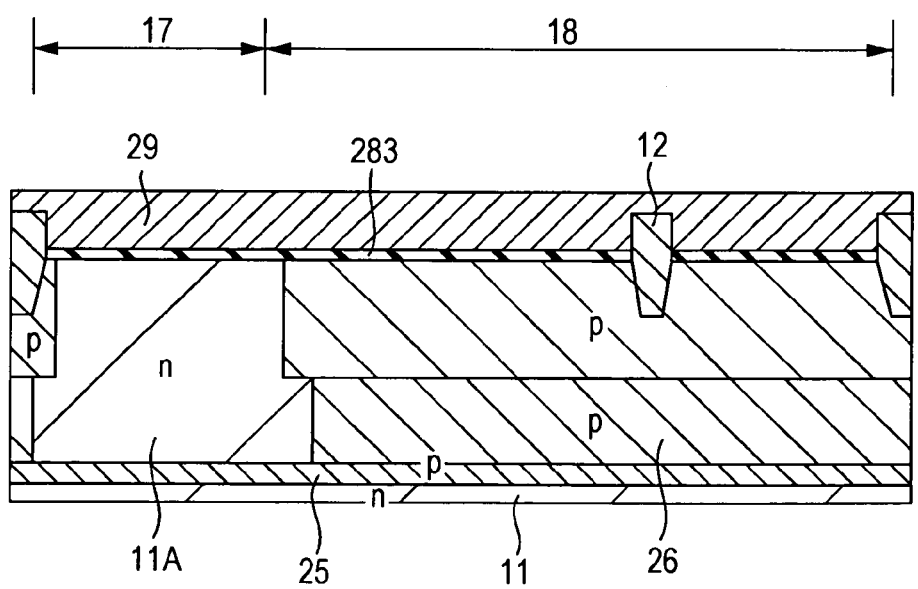

Next, as shown in FIGS. 7A and 7B, gate insulating layers 28 (i.e., the gate insulating layers 281 to 283) are formed on the respective regions 13 to 18 in the CMOS logic circuit unit 4 and the pixel 2, and a gate electrode material layer 29 such as a polycrystalline silicon layer is formed as a layer on top of the gate insulating layer 28.

Note that, in this embodiment, the drawings show a case where the gate insulating layer 281 formed in the first and second MOS transistor forming regions 13 and 14 and the gate insulating layer 282 formed in the third and fourth MOS transistor forming regions 15 and 16 have different thicknesses.

Figure 8A:
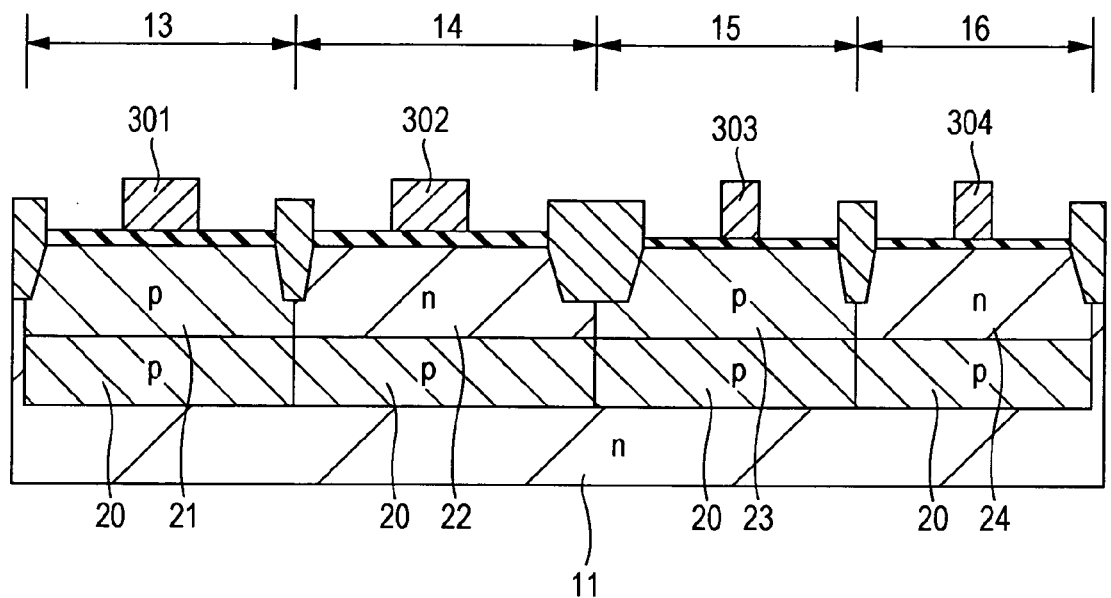
FIGS. 8A and 8B are schematic views for illustrating the example of the method of manufacturing a semiconductor device according to the embodiment of the present invention.
Figure 8B:
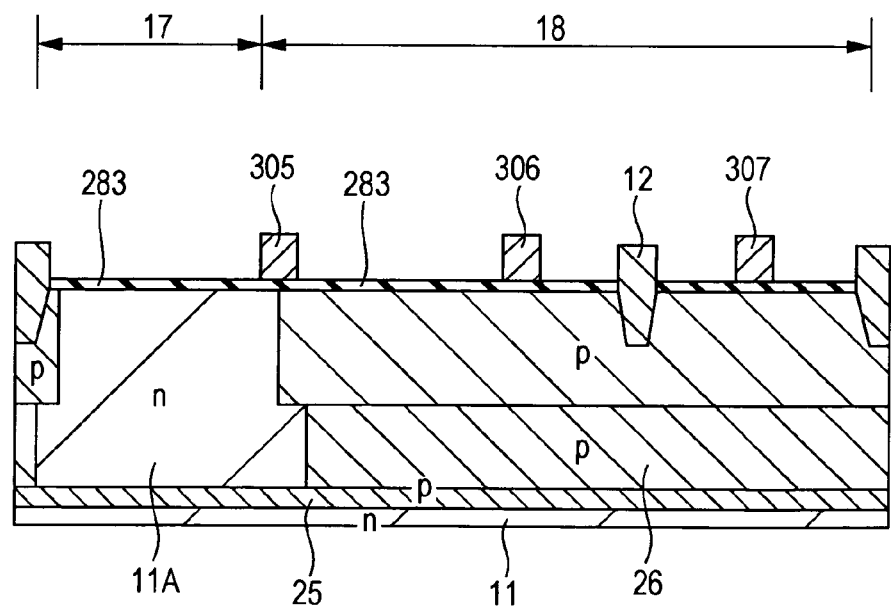

Next, as shown in FIGS. 8A and 8B, the gate electrode material layer 29 is patterned using, for example, a photoresist method and a dry etching method to form the gate electrodes 301 to 307.

For the CMOS logic circuit unit 4, the gate electrode 301 is formed in a position corresponding to the first MOS transistor forming region 13, and the gate electrode 302 is formed in a position corresponding to the second MOS transistor forming region 14. Also, the gate electrode 303 is formed in a position corresponding to the third MOS transistor forming region 15, and the gate electrode 304 is formed in a position corresponding to the fourth MOS transistor forming region 16.

Note that, in this embodiment, the drawings show a case where the gate lengths of the gate electrodes 301 and 302 are greater than the gate lengths of the gate electrodes 303 and 304.

For the pixel 2, the gate electrodes 305, 306, and 307 are formed in a position corresponding to the MOS transistor forming region 18.

Figure 9A:
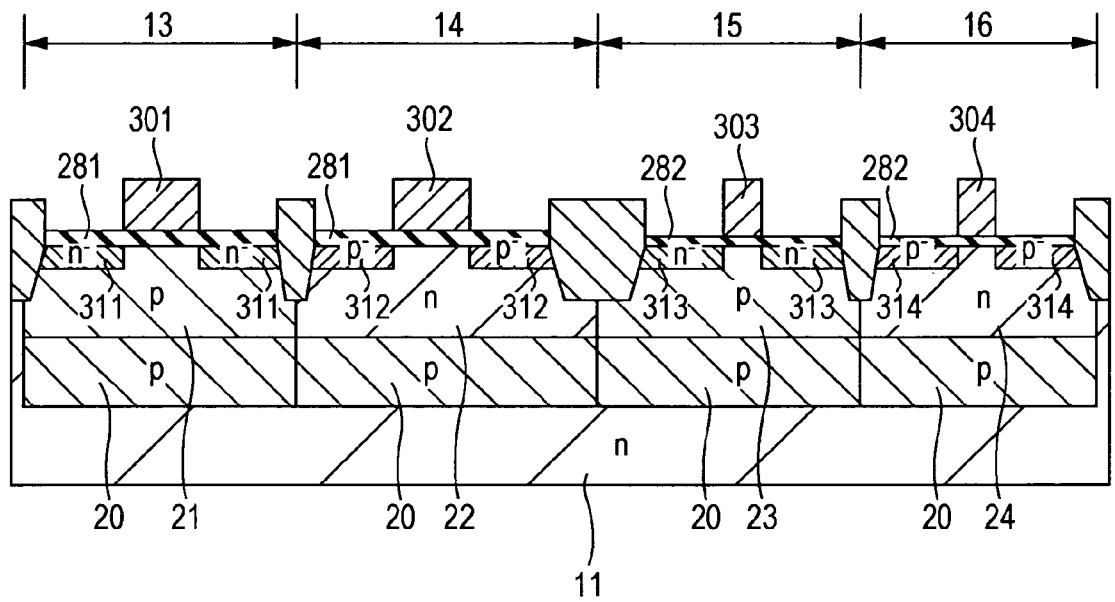
FIGS. 9A and 9B are schematic views for illustrating the example of the method of manufacturing a semiconductor device according to the embodiment of the present invention.
Figure 9B:
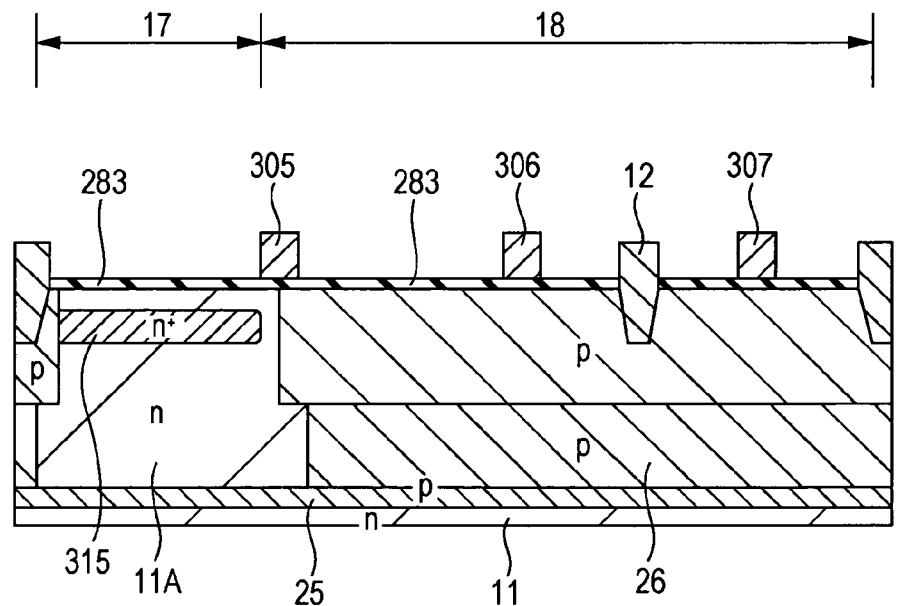

Next, a photoresist mask (not shown) is selectively formed on the MOS transistor forming region 18 in the pixel 2, an appropriate impurity is introduced by the ion implantation method, and an impurity region of an appropriate conductivity type is formed (see FIGS. 9A and 9B). That is, the appropriate impurity is introduced by the ion implantation method and the appropriate impurity region of the appropriate conductivity type is formed with the photoresist mask (not shown), the isolation region 12, and the gate electrodes 301 to 304 as a mask. Then, the photoresist mask is removed.

For the CMOS logic circuit unit 4, the n⁻ regions 311 and 313 having a low impurity concentration and forming the LDD structure are formed in the first and third p-type semiconductor well regions 21 and 23. Also, the p⁻ regions 312 and 314 having a low impurity concentration and forming the LDD structure are formed in the second and fourth n-type semiconductor well regions 22 and 24.

For the pixel 2, the n-type semiconductor region 315 forming the photodiode is formed in the n region (region corresponding to a part of the n-type semiconductor substrate 11) 11A in the sensor unit forming region 17.

Figure 10A:
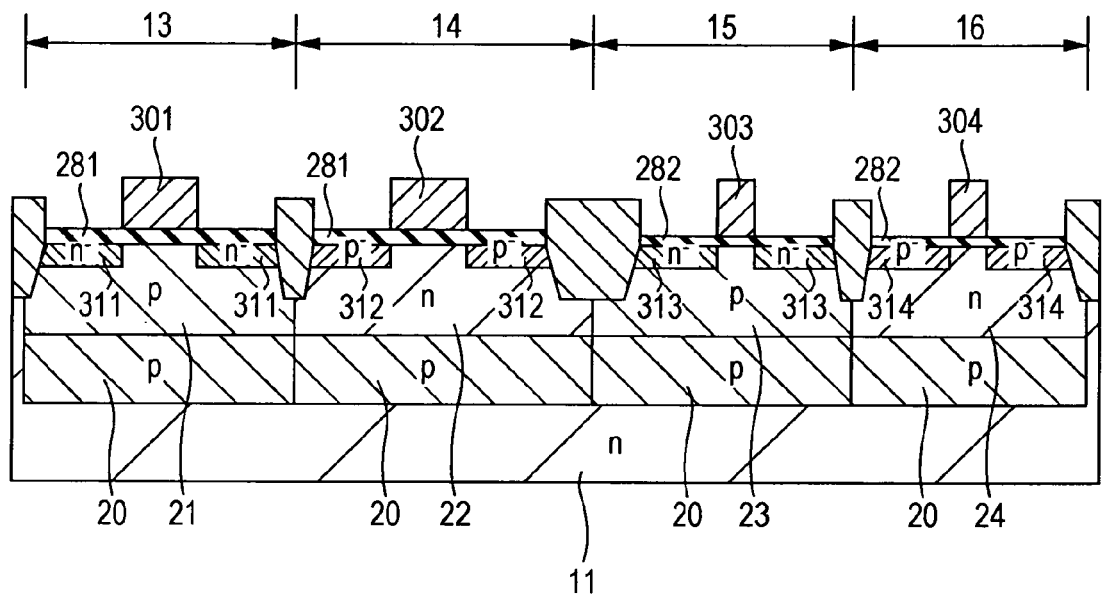
FIGS. 10A and 10B are schematic views for illustrating the example of the method of manufacturing a semiconductor device according to the embodiment of the present invention.
Figure 10B:
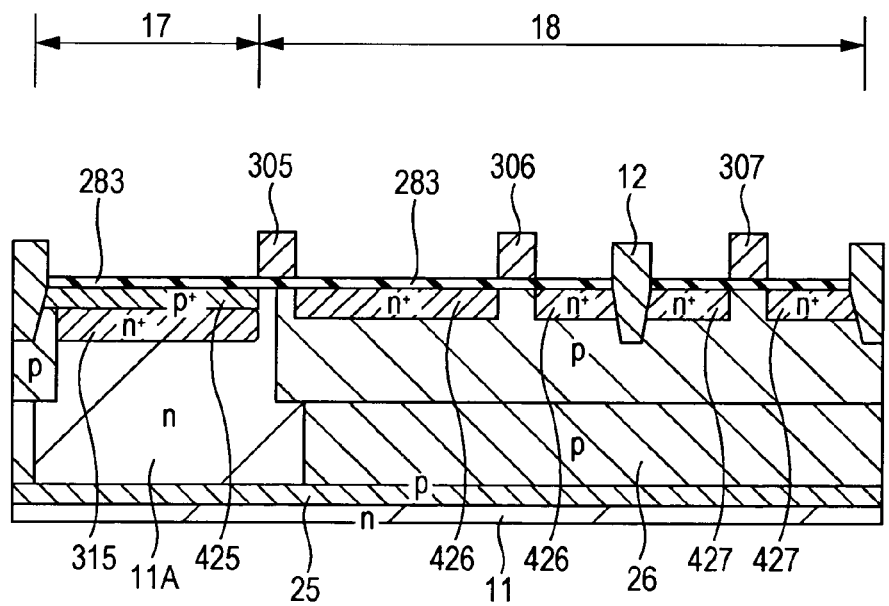

Next, a photoresist mask (not shown) is selectively formed on the CMOS logic circuit unit 4, an appropriate impurity is introduced by the ion implantation method, and an impurity region of an appropriate conductivity type is formed (see FIGS. 10A and 10B). That is, the appropriate impurity is introduced by the ion implantation method and the appropriate impurity region of the appropriate conductivity type is formed with the photoresist mask (not shown), the isolation region 12, and the gate electrodes 305 to 307 as a mask.

Then, the photoresist mask is removed.

For the pixel 2, the p⁺ semiconductor region 425, which is a region into which a highly-concentrated impurity is introduced to form the buried photodiode, i.e., the so-called HAD sensor, for the purpose of further reducing junction leakage current, is formed on the surface of the sensor unit forming region 17. Also, the n⁺ regions 426 and 427 having a high impurity concentration are formed in the MOS transistor forming region 18.

Note that, at the time of the ion implantation, adjustment or the like of an ion implantation region is advisable for a portion (e.g., the FD unit) where a pixel characteristic degradation due to an electric field is a concern. That is, since deterioration of a pixel characteristic due to an electric filed caused by the ion implantation is expected to be more significant than in a typical case of ion implantation through a sidewall, it is advisable to pay attention to the ion implantation region as described above. Specifically, for the portion where a pixel characteristic deterioration due to an electric field is a concern, it is advisable to reduce the ion implantation region.

Figure 11A:
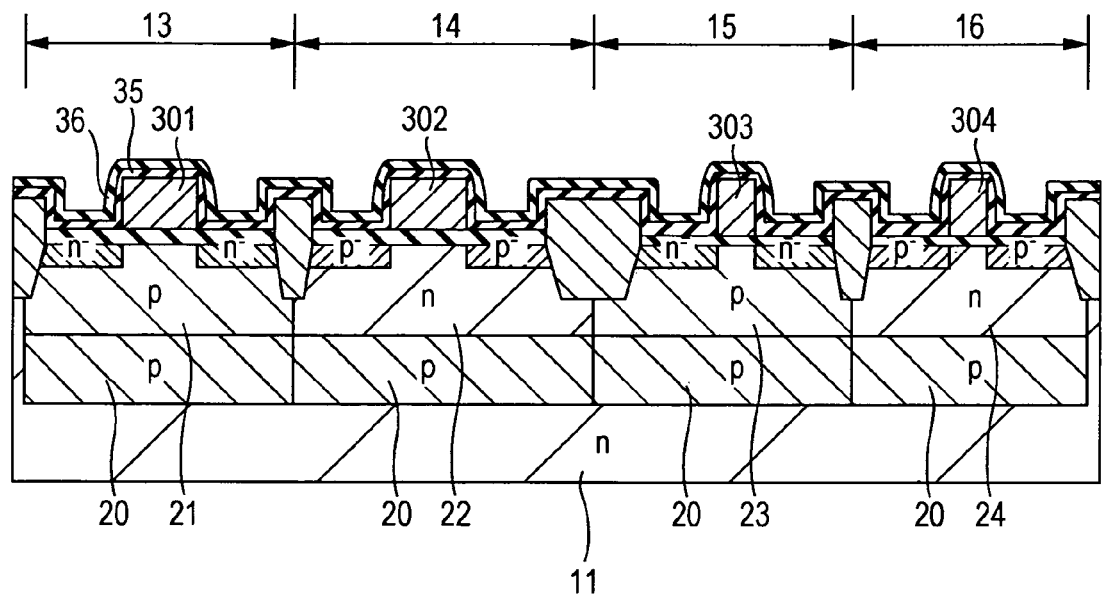
FIGS. 11A and 11B are schematic views for illustrating the example of the method of manufacturing a semiconductor device according to the embodiment of the present invention.
Figure 11B:
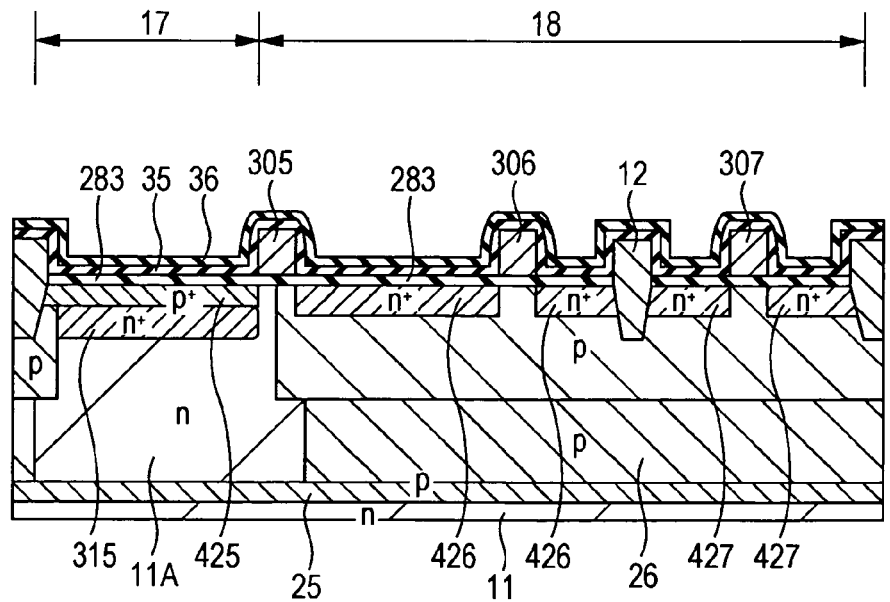

Next, as shown in FIGS. 11A and 11B, the first insulating layer (e.g., silicon oxide layer) 35 and the second insulating layer (e.g., silicon nitride layer) 36 are sequentially formed on the entire surface of the n-type semiconductor substrate 11 including the gate electrodes 301 to 307.

Figure 12A:
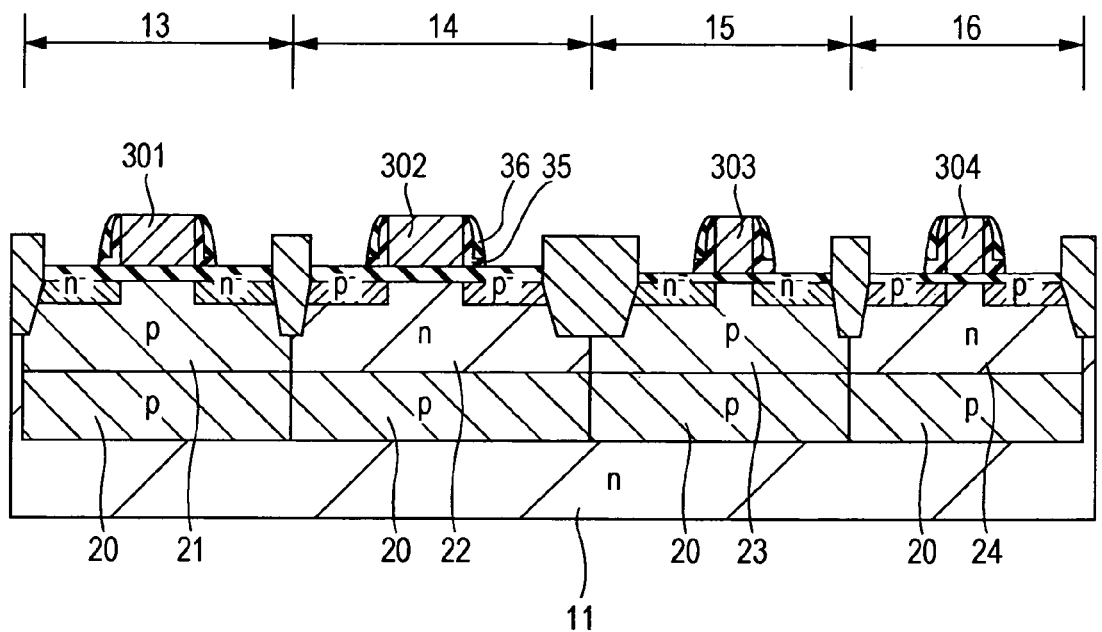
FIGS. 12A and 12B are schematic views for illustrating the example of the method of manufacturing a semiconductor device according to the embodiment of the present invention.
Figure 12B:
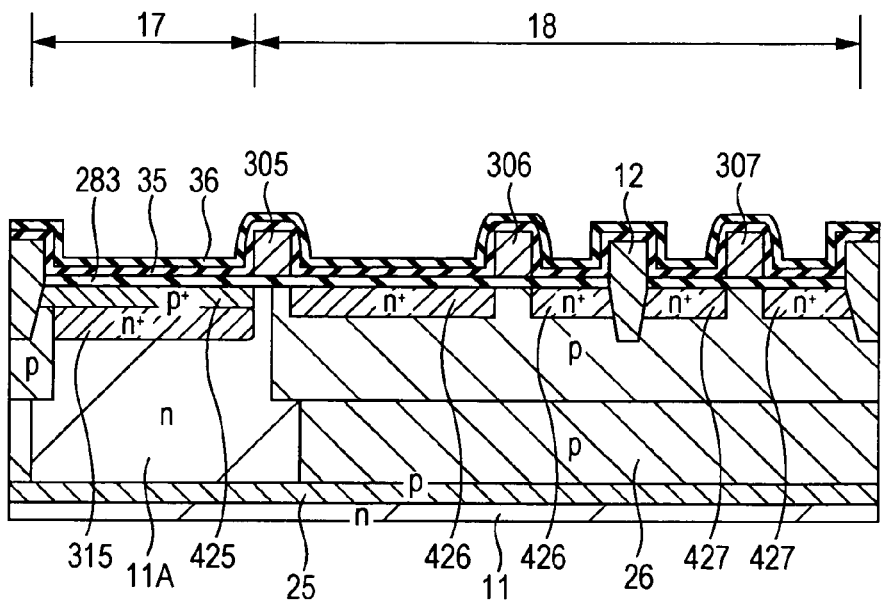

Subsequently, a photoresist mask (not shown) is selectively formed on the second insulating layer 36 in the pixel 2, and etching is performed using an etch-back method in this state on the first insulating layer 35 and the second insulating layer 36 in the CMOS logic circuit unit 4 (see FIGS. 12A and 12B).

Accordingly, a sidewall portion is formed with the first insulating layer 35 and the second insulating layer 36 only at the side of the gate electrodes 301 to 304. Note that the first insulating layer 35 and the second insulating layer 36 outside the sidewall portion are removed, whereby the n-type semiconductor substrate 11 is exposed.

Meanwhile, in the region of the pixel 2, the first insulating layer 35 and the second insulating layer 36 are protected by the photoresist mask and thus remain without being removed by etching.

Then, the photoresist mask is removed.

Figure 13A:
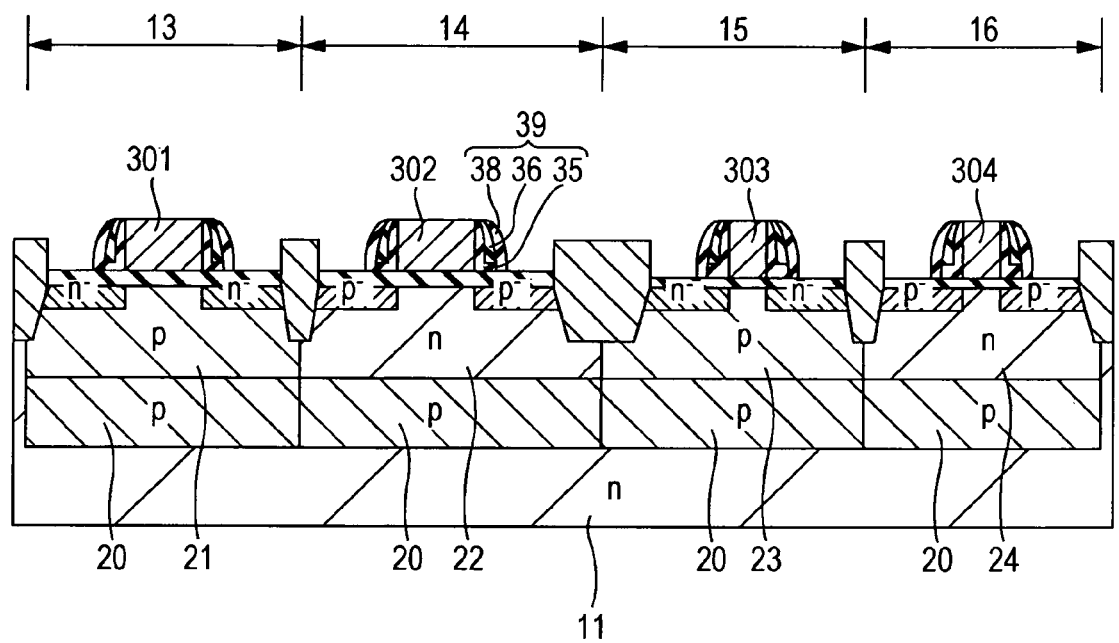
FIGS. 13A and 13B are schematic views for illustrating the example of the method of manufacturing a semiconductor device according to the embodiment of the present invention.
Figure 13B:
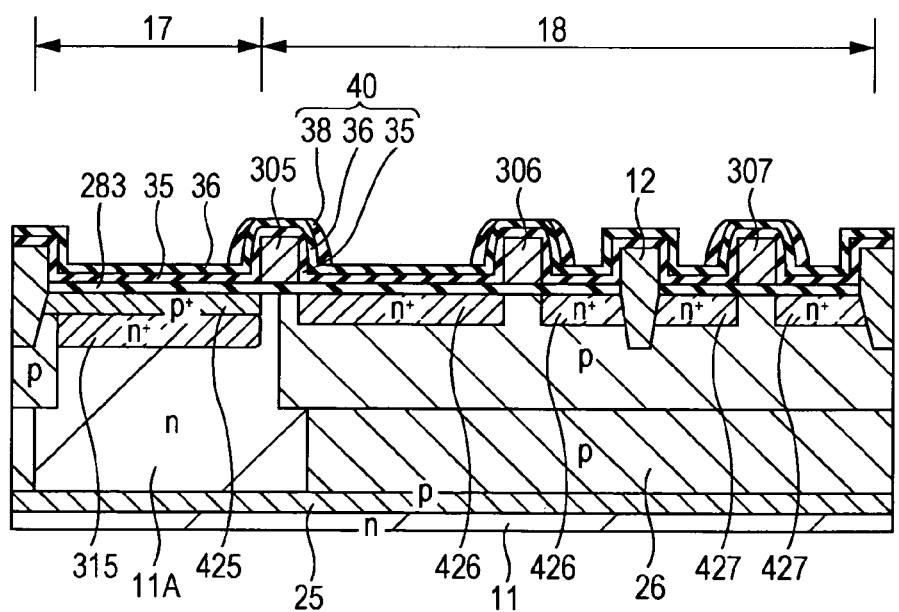

Next, as shown in FIGS. 13A and 13B, the third insulating layer (e.g., silicon oxide layer) 38 is formed on the n-type semiconductor substrate 11, etching is performed on the third insulating layer using the etch-back method, and the sidewall is formed at the side of the gate electrodes 301 to 307.

Accordingly, the sidewall 39 having the three layer structure of the first insulating layer 35, the second insulating layer 36, and the third insulating layer 38 is formed at the side of the gate electrodes 301 to 304 in the CMOS logic circuit unit 4.

Also, the sidewall 40 having the three layer structure of the first insulating layer 35, the second insulating layer 36, and the third insulating layer 38 is formed at the side of the gate electrodes 305 to 307 in the pixel 2.

Figure 14A:
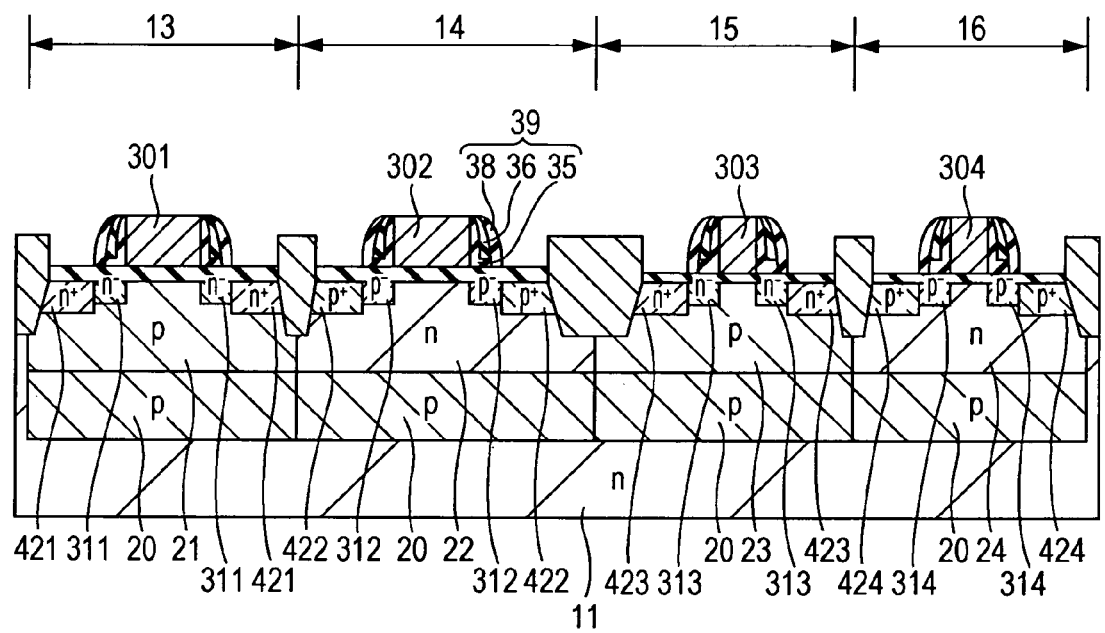
FIGS. 14A and 14B are schematic views for illustrating the example of the method of manufacturing a semiconductor device according to the embodiment of the present invention.
Figure 14B:
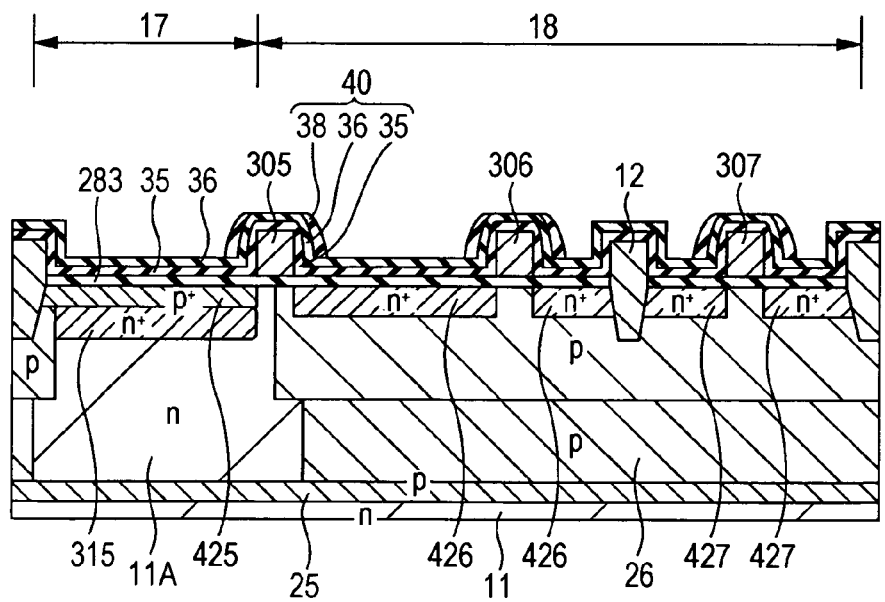

Next, a photoresist mask (not shown) is selectively formed on the pixel 2, an appropriate impurity is introduced by the ion implantation method, and an impurity region of an appropriate conductivity type is formed (see FIGS. 14A and 14B). That is, the appropriate impurity is introduced by the ion implantation method and the appropriate impurity region of the appropriate conductivity type is formed with the photoresist mask (not shown), the isolation region 12, the gate electrodes 301 to 304, and the sidewall 39 as a mask.

Then, the photoresist mask is removed.

For the CMOS logic circuit unit 4, the n⁺ regions 421 and 423 having a high impurity concentration are formed in the p-type semiconductor well regions 21 and 23, and the p⁺ regions 422 and 424 having a high impurity concentration are formed in the n-type semiconductor well regions 22 and 24.

Figure 15A:
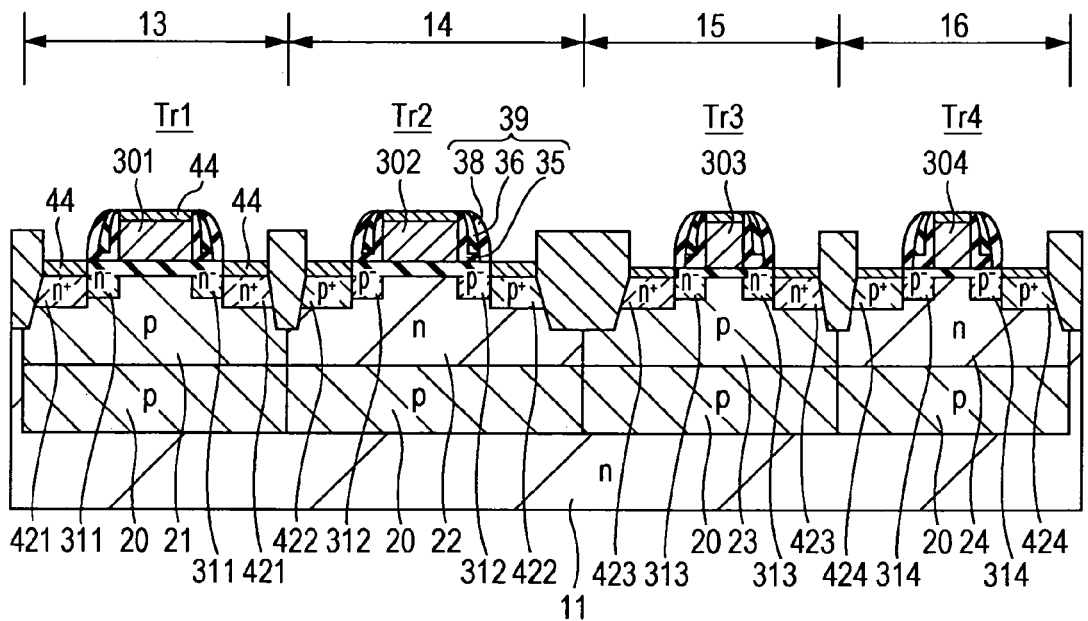
FIGS. 15A and 15B are schematic views for illustrating the example of the method of manufacturing a semiconductor device according to the embodiment of the present invention.
Figure 15B:
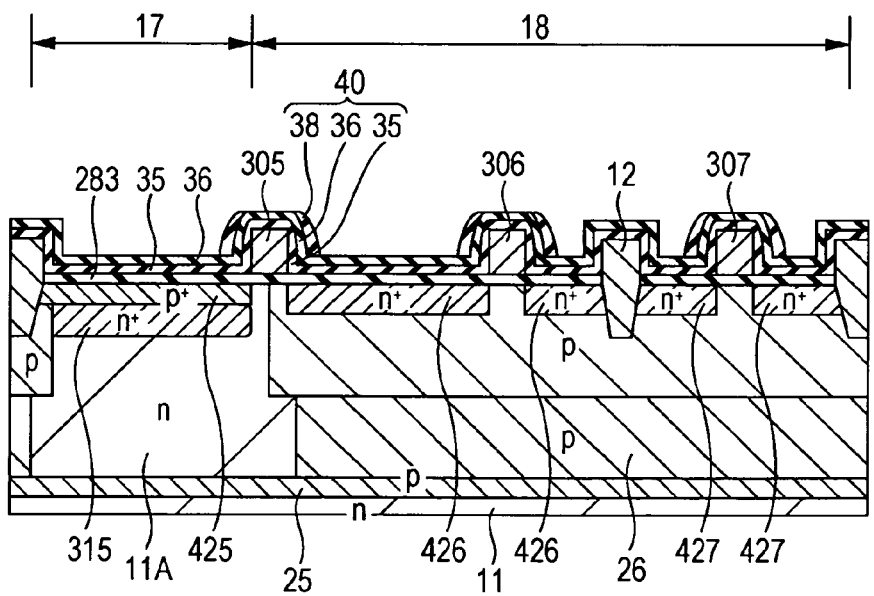

Next, as shown in FIGS. 15A and 15B, the refractory metal silicide layer 44 is formed on the surface of the gate electrodes 301 to 304, the n⁺ regions 421 and 423, and the p⁺ regions 422 and 424 in the CMOS logic circuit unit 4 by a salicide method. Specifically, the refractory metal silicide layer 44 is formed by forming a refractory metal layer on the entire surface of the CMOS logic circuit unit 4 and the pixel 2, performing an alloying process, and removing the unreacted refractory metal layer.

Note that, in the pixel 2, the first insulating layer 35 and the second insulating layer 36 are formed whereas the refractory metal silicide layer 44 is not formed.

Through steps described above, the MOS image sensor shown in FIGS. 1 to 4 can be obtained.

In the method of manufacturing a semiconductor device described above, the source region and the drain region in the pixel 2 are formed before the first insulating layer 35 and the second insulating layer 36 are formed, and the ion implantation is not performed through the first insulating layer 35 and the second insulating layer 36. Therefore, characteristic degradation of a MOS transistor device can be prevented.

Particularly when a nitride layer is used as the blocking layer, a knock-on effect due to ion implantation through a blocking layer is a concern. However, in this embodiment described above, the knock-on effect is prevented even if a nitride layer is used as the blocking layer.

Note that it may be conceivable that the knock-on effect can be prevented without employing a technique according to the embodiment of the present invention, since the knock-on effect does not occur when an oxide layer instead of a nitride layer is employed as a blocking layer. However, since the function of an oxide layer as the blocking layer is inferior to the function of a nitride layer as the blocking layer, the thickness is increased when the oxide layer is employed as the blocking layer. Thus, in terms of reducing the thickness of the semiconductor device, it is hardly suitable. On the other hand, employing the technique according to the embodiment of the present invention enables the knock-on effect to be prevented while employing a nitride layer which functions sufficiently as the blocking layer even with a small thickness.

Also, in the method of manufacturing a semiconductor device described above, the first insulating layer 35 and the second insulating layer 36 which function as the blocking layer are part of a layer forming the sidewall. Therefore, a blocking layer is formed not in addition to the sidewall, whereby the number of steps can be reduced in manufacturing a semiconductor device.

<2. Another Embodiment>

Figure 16:
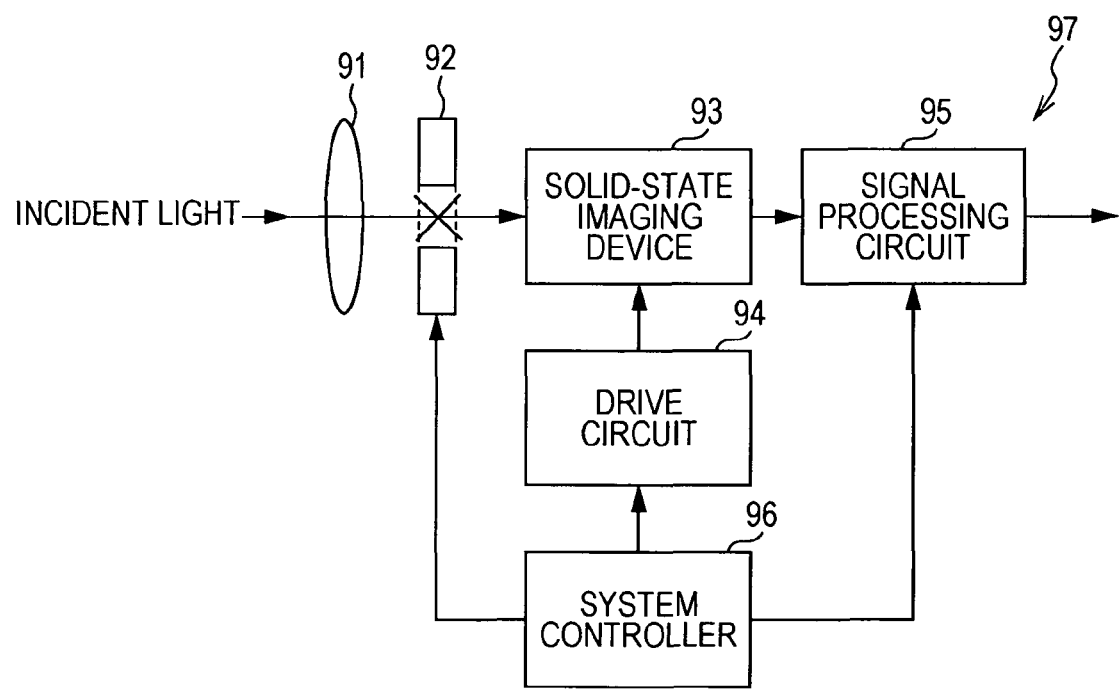
FIG. 16 is a schematic view for illustrating a camera as an example of a solid-state imaging apparatus according to another embodiment of the present invention.

FIG. 16 is a schematic view for illustrating a camera 97 as an example of a solid-state imaging apparatus according to another embodiment of the present invention. In the camera 97 shown herein, the semiconductor device (solid-state imaging device) according to the embodiment described earlier is used as an imaging device.

In the camera 97 shown herein, light from an object (not shown) enters an imaging area of a solid-state imaging device 93 through an optical system such as a lens 91 and a mechanical shutter 92.

Note that the mechanical shutter 92 blocks incident light upon the imaging area of the solid-state imaging device 93 and determines the exposure time.

The solid-state imaging device 93 uses the MOS image sensor 1 according to the embodiment described earlier, and is driven by a timing generator or a drive circuit 94 including a drive system or the like.

An output signal of the solid-state imaging device 93 is subjected to various signal processing by a signal processing circuit 95 at the next stage, and is sent externally as an imaging signal. The sent imaging signal is stored in a storage medium such as a memory or output to a monitor.

Note that opening/closing control of the mechanical shutter 92, control of the drive circuit 92, control of the signal processing circuit 95, and the like are performed by a system controller 96.

Since the MOS image sensor according to the embodiment described earlier of the present invention is employed in the camera 97 according to this embodiment, characteristic degradation of a MOS transistor device can be prevented and a high-quality image can be obtained.

<3. Modification Example>

[Circuit Configuration of the Pixel]

Figure 2B:
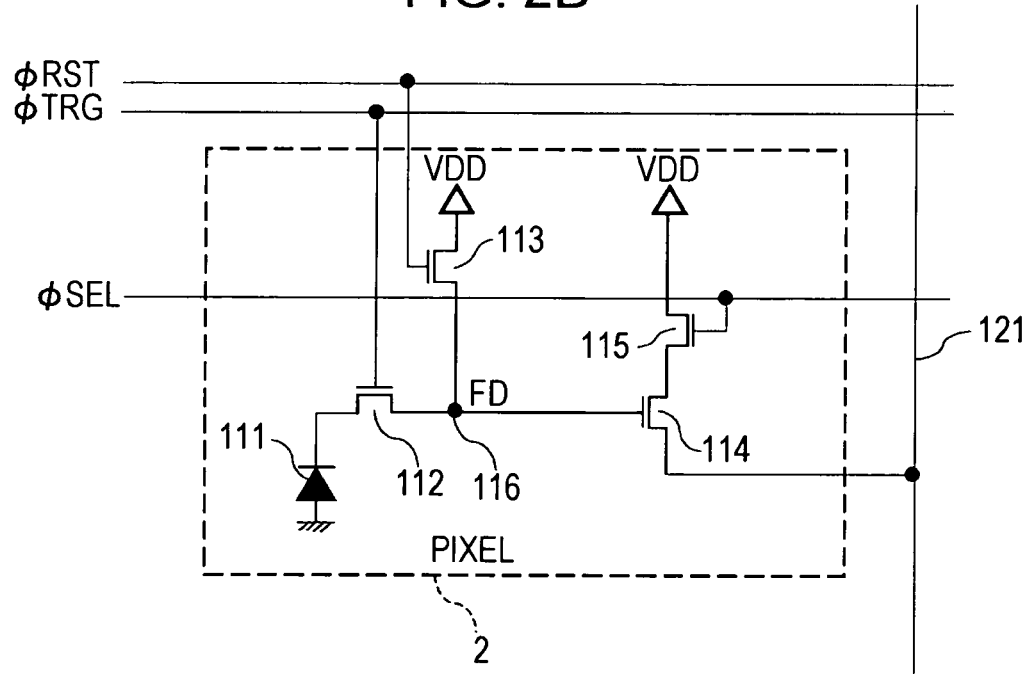
FIG. 2B is a schematic view for illustrating another circuit configuration of the pixel.

Although the circuit configuration in FIG. 2A has been described as an example of the circuit configuration of the pixel 2 in the embodiment described first, the circuit configuration of the pixel 2 is not limited to that in FIG. 2A and may be, for example, the circuit configuration in FIG. 2B.

The pixel 2 shown in FIG. 2B has a pixel circuit including four pixel transistors, i.e., the transfer transistor 112, the reset transistor 113, the amplification transistor 114, and a selection transistor 115, in addition to the photodiode 111.

Note that, herein, a case where n-channel MOS transistors are used as the pixel transistors 112 to 115 is given as an example.

The transfer transistor 112 is connected between the cathode of the photodiode 111 and the FD unit 116. The transfer transistor 112 transfers a signal charge (electron) obtained from photoelectric conversion and stored in the photodiode 111 to the FD unit 116 by applying the transfer pulse φTRG to the gate.

The drain and source of the reset transistor 113 are respectively connected to a power supply VDD and the FD unit 116. The reset transistor 113 resets the electrical potential of the FD unit 116 by applying the reset pulse RST to the gate before transfer of the signal charge from the photodiode 111 to the FD unit 116.

The drain and source of the selection transistor 115 are respectively connected to the power supply VDD and the drain of the amplification transistor 114. The selection transistor 115 shifts to an on-state through application of a selection pulse φSEL to the gate, and selects the pixel 2 by supplying the power supply VDD to the amplification transistor 114.

Note that a configuration is also possible in which the selection transistor 115 is connected between the source of the amplification transistor 114 and the vertical signal line 121.

The amplification transistor 114 has a source follower configuration in which the gate, the drain, and the source are respectively connected to the FD unit 116, the source of the selection transistor 115, and the vertical signal line 121. The amplification transistor 114 outputs the electrical potential of the FD unit 116 after reset by the reset transistor 113 as the reset level to the vertical signal line 121. Further, the amplification transistor 114 outputs the electrical potential of the FD unit 116 after the transfer of the signal charge by the transfer transistor 112 as the signal level to the vertical signal line 121.

[Another Circuit Configuration of The Pixel]

Although a case where the pixel transistor is provided for each photodiode has been described as an example in the circuit configurations shown in FIGS. 2A and 2B, the pixel transistor may be not provided for each photodiode. Therefore, the circuit configuration may be such that multiple photodiodes share the pixel transistor.

[On Polarity]

Although a case where an n-type semiconductor substrate is used as the common semiconductor substrate 11 has been described as an example in the embodiment described first, a p-type semiconductor substrate may be used instead of the n-type semiconductor substrate. Also, the respective semiconductor regions may be formed with conductivity types opposite to those in the embodiment described first.

[On LDD Structure]

Although a case where the respective MOS transistors Tr1 to Tr4 in the CMOS logic circuit unit 4 have the LDD structures has been described as an example in the embodiment described first, the LDD structure may be not employed.

[On Application]

A case where the embodiment described first of the present invention is applied to the MOS image sensor which is a solid-state imaging device has been described as an example of the semiconductor device. However, applications of the present invention are not limited to the solid-state imaging device. Applications are possible to semiconductor devices in general.

The present application contains subject matter related to that disclosed in Japanese Priority Patent Application JP 2010-016284 filed in the Japan Patent Office on Jan. 28, 2010, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor device comprising:
   a substrate having a pixel region and a peripheral circuit region;
   a gate electrode formed on the substrate with a gate insulating layer being between the gate electrode and the substrate;
   two or more insulating layers that provide a silicide block, formed in the pixel region and the peripheral circuit region of the substrate so as to cover the gate electrode;
   a sidewall formed from at least a portion of the two or more insulating layers in the peripheral circuit region;
   a photodiode region formed from a first impurity region and a second impurity region in the pixel region and a third impurity region formed in the peripheral circuit region before the two or more insulating layers are formed; and
   a silicide layer formed on a surface of the third impurity region of the substrate,
   wherein the two or more insulating layers includes a silicon nitride layer and a silicon oxide layer, and
   wherein a region in which the second impurity region is formed is reduced in response to a degree of deterioration in pixel characteristic to be caused by a formation process in forming the second impurity region.

2. The semiconductor device according to claim 1, wherein the silicide layer is also formed on a surface of the gate electrode provided in the peripheral circuit region.

3. The semiconductor device according to claim 2, wherein the third impurity region is a source electrode or a drain electrode of a transistor including the gate electrode.

4. The semiconductor device according to claim 1, wherein the gate electrode is formed of a polycrystalline silicon layer.

5. The semiconductor device according to claim 1, wherein the photodiode region is further formed from the first impurity region and an other second impurity region, the first impurity region being located above and in contact with the other second impurity region, the first impurity region and the other second impurity region extending to a location at a side of the gate electrode or of another gate electrode, that is located in the pixel region of the substrate.

6. The semiconductor device according to claim 1, wherein the sidewall is formed at a side of another gate electrode that is located in the peripheral circuit region of the substrate.

7. The semiconductor device according to claim 1, wherein the first impurity region and the second impurity region extend to a side of the gate electrode.

8. The semiconductor device according to claim 1, wherein the silicide layer is not formed over the pixel region.

9. The semiconductor device according to claim 1, wherein the peripheral circuit region includes one or more selected from a group consisting of a CMOS logic circuit and an analog circuit.

10. A solid-state imaging apparatus comprising:
    a substrate having a pixel region and a peripheral circuit region;
    a gate electrode formed on the substrate with a gate insulating layer being between the gate electrode and the substrate;
    two or more insulating layers that provides a silicide block, formed in the pixel region and the peripheral circuit region of the substrate so as to cover the gate electrode;
    a sidewall formed from at least a portion of the two or more insulating layers in the peripheral circuit region;
    a photodiode region formed from a first impurity region and a second impurity region in the pixel region and a third impurity region formed in the peripheral circuit region before the two or more insulating layers are formed;
    a silicide layer formed on a surface of the second impurity region of the substrate; and
    an optical system which guides incident light to the pixel region,
    wherein the two or more insulating layers includes a silicon nitride layer and a silicon oxide layer, and
    wherein a region in which the second impurity region is formed is reduced in response to a degree of deterioration in pixel characteristic to be caused by a formation process in forming the second impurity region.

11. The solid-state imaging apparatus according to claim 10, wherein the silicide layer is also formed on a surface of the gate electrode provided in the peripheral circuit region.

12. The solid-state imaging apparatus according to claim 11, wherein the third impurity region is a source electrode or a drain electrode of a transistor including the gate electrode.

13. The solid-state imaging apparatus according to claim 10, wherein the gate electrode is formed of a polycrystalline silicon layer.

14. The solid-state imaging apparatus according to claim 10, wherein the photodiode region is further formed from the first impurity region and an other second impurity region, the first impurity region being located above and in contact with the other second impurity region, the first impurity region and the other second impurity region extending to a location at a side of the gate electrode or of another gate electrode, that is located in the pixel region of the substrate.

15. The solid-state imaging apparatus according to claim 10, wherein the sidewall is formed at a side of another gate electrode that is located in the peripheral circuit region of the substrate.

16. The solid-state imaging apparatus according to claim 10, wherein the first impurity region and the second impurity region extend to a side of the gate electrode.

17. The solid-state imaging apparatus according to claim 10, wherein the silicide layer is not formed over the pixel region.

18. The solid-state imaging apparatus according to claim 10, wherein the peripheral circuit region includes one or more selected from a group consisting of a CMOS logic circuit and an analog circuit.

19. A camera comprising a lens and the solid-stage imaging apparatus according to claim 10.

* * * * *